METHOD OF MAKING SEMICONDUCTOR DEVICES MOUNTED ON A HEAT SINK

Filed Aug. 5, 1971 2 Sheets-Sheet 1

INVENTORS
KENNETH P. WELLER &
CHENG P. WEN
BY [signature]
ATTORNEY

INVENTOR.
KENNETH P. WELLER &
CHENG P. WEN
BY Donald S. Cohen
ATTORNEY

United States Patent Office 3,728,236

Patented Apr. 17, 1973

3,728,236
METHOD OF MAKING SEMICONDUCTOR DEVICES MOUNTED ON A HEAT SINK

Kenneth Perry Weller, Hightstown, and Cheng Paul Wen, Mercer, N.J., assignors to RCA Corporation Filed Aug. 5, 1971, Ser. No. 169,438
Int. Cl. C23b 3/00
U.S. Cl. 204—129.1 10 Claims

ABSTRACT OF THE DISCLOSURE

A region of a semiconductor material which is of a conductivity type or types required by the semiconductor devices being formed is provided on a low resistivity P type semiconductor substrate with a thin barrier region of high resistivity semiconductor material being between the substrate and the semiconductor device region. A metal heat sink body is provided on the semiconductor device region. The substrate is then removed by electrolytically etching the substrate. The barrier region is removed by chemically etching to expose a surface of the semiconductor device region. Contact pads are formed on the surface of the semiconductor device region and the semiconductor device region-metal body composite is divided into individual semiconductor devices each mounted on a heat sink.

BACKGROUND OF THE INVENTION

The present invention relates to a method of making semiconductor devices which are mounted on heat sinks and more particularly to a method of making such devices which are small in size and wherein the semiconductor material of the devices is very thin.

Recently there has been developed various semiconductor devices which are capable of operating at high powers in the microwave frequency ranges, such as avalanche diodes and transferred electron effect devices. A problem which has arisen with such devcies is to provide for good dissipation of heat from the devices since excessive temperatures can cause the devices to fail. To obtain good heat dissipation from the semiconductor devices, it has been the practice to mount the devices on a body of good heat conducting material, such as a metal block, which acts as a heat sink for the device. However, because of the small size of such devices it is difficult to mount the individual semiconductor devices on individual metal blocks. To overcome this problem various techniques have been developed for mounting a large wafer of the semiconductor material on a large metal body and then dividing the semiconductor material-metal block composite into individual semiconductor devices each of which is mounted on a heat sink metal block.

However, in each of these techniques there is a problem which arises from the fact that the semiconductor body which forms the device is generally very thin, in the order of 10 microns in thickness. To handle a larger wafer which is this thin is very difficult since such a thin wafer is very brittle and subject to be easily broken. To overcome this problem, it has been the practice to use a relatively thick wafer, in the order of .075mm in thickness, which can be more easily handled. After the wafer is mounted on the metal body, the wafer is then thinned down to the desired thickness either by mechanical or chemical polishing techniques. Thinning the wafer by mechanically polishing it has the disadvantage that as the wafer becomes thinner it becomes more subject to being broken under the application of the mechanical polishing process. Also, the mechanical polishing processes have a tendency to create defects in the surface of the wafer which can adversely affect the electrical characteristics of the devices being formed. Thinning the wafer by chemically polishing it has the disadvantage that the chemical polishing process has a tendency to provide the wafer with a curved surface rather than a flat surface, particularly when the wafer must be thinned a large amount. Thus, the thinned wafer would be of non-uniform thickness so that the individual devices made from the wafer would be of non-uniform thickness.

SUMMARY OF THE INVENTION

Semiconductor devices are made by providing on a surface of a substrate of low resistivity P type semiconductor material a first region of high resistivity semiconductor material. A second region of semiconductor material is provided on the first region. The second region is of a conductivity type or types required by the semiconductor devices being formed. A metal body is provided on the second region. The substrate is electrolytically etched away to expose the first region. The first region is chemically etched away to provide a composite of the second region of the metal body. The composite is then divided into the individual semiconductor devices.

DETAILED DESCRIPTION

Figure 2:
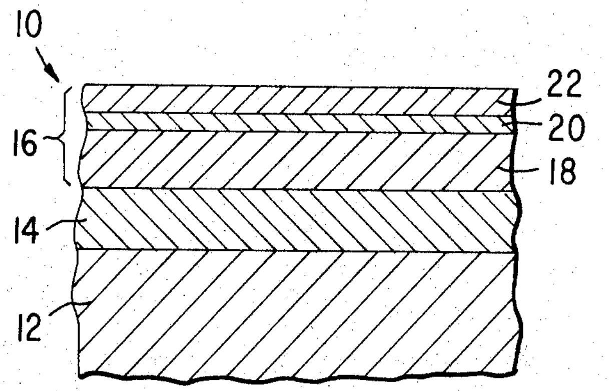
FIG. 2 is a sectional view of a form of the semiconductor wafer used in the method of the present invention.

Referring initially to FIG. 2, there is shown a form of a semiconductor material wafer, generally designated as 10, used in the method of the present invention to make the semiconductor devices. The wafer 10 comprises a substrate 12, a first region 14 on a surface of the substrate 12, and a second region 16 on the surface of the first region 14. The wafer 10 may be of any type of single crystalline semiconductor material, such as silicon, germanium or a group III–V semiconductor devices being made. The substrate 12 is of P+ type conductivity and of a resistivity as low as possible, for example in the range of 0.001 ohm-cm. The substrate 12 may be of any desired thickness which permits ease of handling the substrate. The first region 14 is of either P- or N-type conductivity and should be of a resistivity as high as possible. As will be explained, the first region 14 serves as an etching barrier region. For this purpose, the carrier concentration in the first region 14 should not exceed approximately $10^{17}$ cm.$^{-3}$. The first region 14 should be relatively thin, for example a few microns in thickness.

The second region 16 is the portion of the wafer 10 which forms the semiconductor devices being made. Therefore, the second region 16 is of a conductivity type or types required by the semiconductor devices being made. As shown, the second region 16 is of a construction to form an avalanche diode which includes a layer 18 of N+ type conductivity, a layer 20 of N type conductivity and a layer 22 of P+ type conductivity. However, the second region 16 may be constructed to form any type of semiconductor device. For example to form transferred electron effect devices, the second region 16 may be a layer of N type conductivity sandwiched between two layers of N+ type conductivity. To form Schottky surface barrier diodes, the second region 16 may be a layer of either conductivity type over a low resistivity layer of the same conductivity type.

Figure 1:
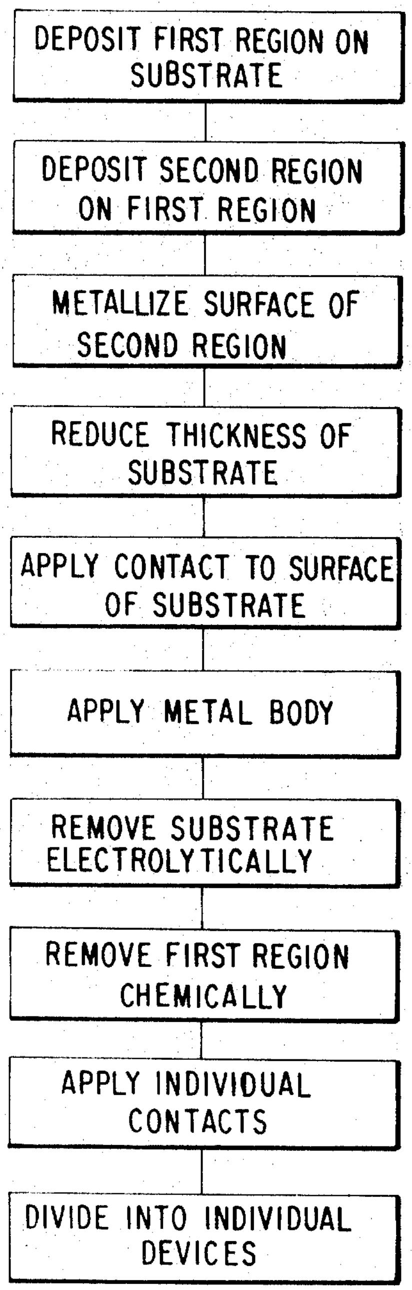
FIG. 1 is a flow chart of the method of the present invention.

As indicated in the flow chart of FIG. 1, the wafer 10 can be formed by first depositing on the surface of the substrate 12 an epitaxial layer of the high resistivity semiconductor material to form the first region 14. The first region 14 may be deposited by any well known epitaxial deposition technique for the particular semiconductor material being used. The second region 16 is then deposited on the first region 14. The three layers 18, 20 and 22 of the second region 16 may be individually deposited in succession by any well known epitaxial deposition technique. Alternatively, after the N+ type layer 18 is deposited, a layer of N type conductivity and of a combined thickness of the layers 20 and 22 may be deposited and a P type conductivity modifier diffused or implanted into this thick layer to form the N type layer 20 and P+ type layer 22.

Figure 3:
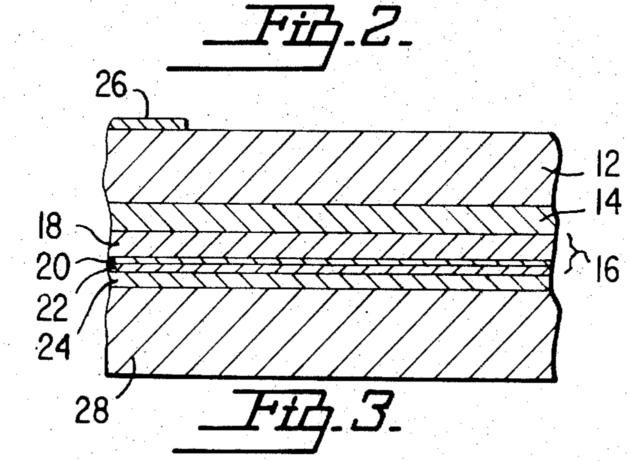
FIGS. 3, 4 and 5 are sectional views illustrating the semiconductor devices at various steps of the method of the present invention.

A metal film 24, shown in FIG. 3, is then coated on the surface of the second region 16. The firm 24 is of any metal which adheres well to and makes good ohmic contact with the material of the second region 16. The metal film 24 may be coated on the second region 16 by any well known metal deposition technique, such as electroplating, sputtering or evaporation in a vacuum. The substrate 12 is then thinned down to a thickness whereby it can be easily completely removed in a manner which will be explained later, yet the total thickness of the wafer 10 is still thick enough to be easily handled without being subject to being broken. The substrate 12 can be thinned down until the wafer thickness is in the order of .075 mm. and still provide a sufficiently rigid wafer. The substrate 12 is preferably thinned down by any well known chemically polishing technique so as to provide the substrate with a defect free polished surface.

A small area metal film contact 26 is coated on the polished surface of the substrate 12, preferably at the edge of the surface as shown in FIG. 3. The contact 26 may be of any electrically conductive metal which makes good ohmic contact with the particular semiconductor material of the substrate 12. The contact 26 may extend either completely around or only partially around the surface of the substrate 12 as long as it is of sufficient area to permit a wire to be attached thereto.

A metal heat sink body 28 is then applied to the metal film 24 on the second region 16 as shown in FIG. 3. The metal body 28 may be of any electrically conductive metal which is a good conductor of heat, such as copper or silver. The metal body 28 should be of a thickness slightly less than the thickness of the wafer 10 to minimize any bowing of the wafer-metal body composite which may occur due to the difference in the coefficient of expansion of the semiconductor material and the metal. Thus, if the wafer 10 is of a thickness of 0.1 mm., the metal body 28 may be of a thickness of 0.075 mm. The metal body 28 may be applied to the metal film 24 by any well known technique, such as by electroplating.

Figure 6:
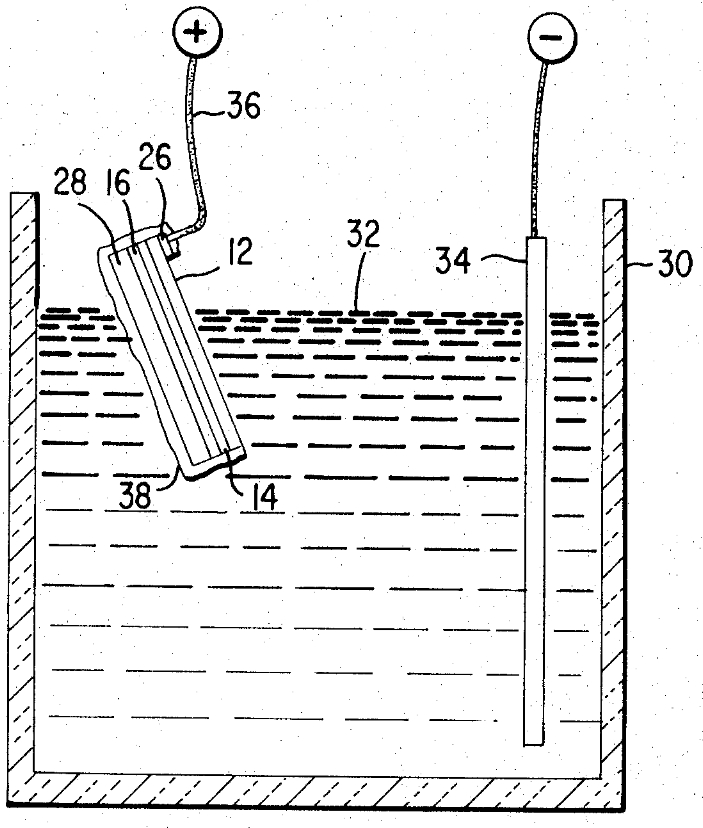
FIG. 6 is a schematic view of an apparatus used to carry out one operation of the method of the present invention.

The substrate 12 is then completely removed. This is mainly achieved by electrolytically etching the substrate 12. Electrolytically etching the low resistivity P+ type substrate 12 will relatively quickly remove the relatively thick substrate down to the high resistivity second region 14 but will not etch the second region 14. Thus, the high resistivity second region 14 acts as a barrier to limit the action of the electrolytic etch and prevent etching of the first region 16. The electrolytic etching can be carried out in an apparatus such as shown in FIG. 6. This apparatus includes a container 30 which contains a suitable electrolytic bath 32. A metal cathode 34 is inserted in the electrolytic bath 32 and is connected to the negative side of a source of D.C. current, such as a battery. Although various electrically conductive metals can be used for the cathode 34, it has been found that platinum is most suitable. Also, the cathode 34 should be in an area at least 100 times larger than the area of the substrate 12 in order to reduce the electrolytic cell resistance.

The electrolytic bath 32 may be of any known composition suitable for etching the particular semiconductor material of the substrate 12. For example, a 2% to 10% aqueous solution of hydrofluoric acid has been used for silicon and a basic solution, such as potassium or sodium hydroxide, has been used for either germanium or gallium arsenide. However, to insure proper selective etching of the P+ type substrate it is desirable that the applied voltage used in the electrolytic etching operation be relatively low, below approximately 0.5 volts. Also a relatively high current density is also desired when etching silicon to eliminate the formation of a residue on the surface being etched since such a residue will disrupt the etching process. In the use of the hydrofluoric acid solution for etching silicon, it has been found difficult to maintain the sufficiently high current density necessary to prevent the formation of the residue while keeping the applied voltage low enough to achieve good selective etching. However, it has been found that the addition of a small amount of another acid, such as sulfuric acid to the hydrofluoric acid solution results in a marked increase in the current density at a fixed applied voltage while not noticeably increasing the threshold current density for prevention of residue buildup. Thus, for electrolytically etching silicon, an electrolytic bath of an aqueous solution of a mixture of hydrofluoric acid and sulfuric acid permits the use of an applied voltage of less than 0.5 volts and a current density which is high enough to prevent the formation of any undesirable residue on the surface being etched.

To electrolytically etch the substrate 12, a wire 36 is connected to the contact 26 of the surface of the substrate 12. A protective coating 38 is applied to the contact 26, the peripheral edge surface of the wafer-metal body composite and the surface of the metal body 28 as shown in FIG. 6. The protective coating 38 is of a material which is not attacked by the electrolytic bath 32, such as a wax or resin. The wire 36 is connected to the positive side of the source of D.C. current, and the wafer-metal body composite is inserted into the electrolytic bath 32 to complete the electrical circuit and thereby electrolytically etch the exposed surface of the substrate 12. To achieve complete etching of the substrate 12 without the formation of any electrically isolated islands, it is preferable to immerse the wafer-metal body composite into the electrolytic bath 32 at an angle with respect to the surface of the cathode 24 with the contact 26 being the farthest from the cathode and the edge of the composite farthest from the contact 26 being immersed first as shown in FIG. 6. Also, it has been found desirable to slowly immerse the composite into the bath by repeatedly dipping it into the bath while increasing the amount of the composite immersed as the dipping continues. In this manner the portion of the substrate 12 farthest from the contact 26 is etched away first since it is in the bath the longest time, and the etching action progresses across the substrate until the contact 26 is reached. It has been found that this etching technique is more effective on a defect free surface. It is for this reason that the thinning of the substrate 12, previously described, is preferably carried out by chemical etching to provide a substantially defect free surface of the electrolytic etch.

The electrolytic etch will remove all of substrate 12, without etching the first region 14, except the portion of the substrate directly under the contact 26. This small portion of the substrate 12 is then removed by a quick chemical etch.

The first region 14 is then completely removed to expose the surface of the second region 16. The first region 14 is preferably removed by a smooth chemical etch so that the exposed surface of the second region 16 will be smooth. Since the first region 14 is relatively thin, it can be removed by a chemical etch and still provide the second region 16 with a flat surface.

Figure 4:
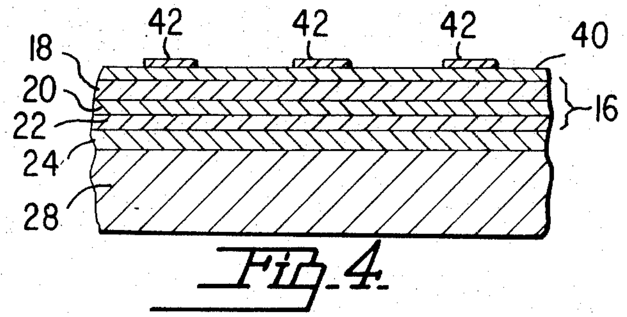

Individual contact pads are then formed on the areas of the exposed surface of the second region 16 which are to form the individual semiconductor devices. As shown in FIG. 4, this can be achieved by first coating the exposed surface of the second region 16 with a thin film 40 of an electrically conductive metal which will adhere to and make good ohmic contact with the particular semiconductor material of the second region. The metal film 40 can be applied by any well known technique, such as vacuum evaporation. The areas of the metal film 40 which are to form the contact pads are then coated with a layer 42 of a protective metal, such as gold. This can be achieved by applying a resist material on the metal film 40 except where the contact pads are to be formed using standard photolithographic techniques. The metal layers 42 can then be applied to the exposed areas of the metal film 40 by electroplating. The areas of the metal film 40 not covered by the metal layers 42 are then removed with a suitable etchant to form the individual contact pads with the surface area of the second region around and between the contact pads being exposed.

Figure 5:
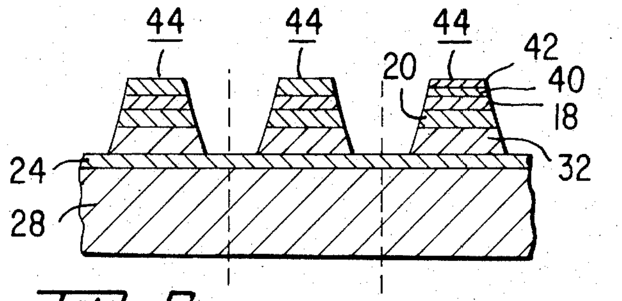

The second region-metal body composite is then divided into the individual semiconductor devices. This can be achieved by first removing the portion of the second region 16 between and around the contact pads down to the metal film 24, such as with a suitable chemical etchant. This leaves a plurality of the individual semiconductor devices 44 all mounted on the metal body 28 as shown in FIG. 5. The metal body 28 is then divided along lines, such as indicated by the dash line in FIG. 5, between the individual semiconductor devices 44. The metal body 28 can be divided by either etching therethrough or by mechanical means, such as a wire saw. This provides a plurality of the individual semiconductor devices 44 each mounted on a heat sink metal body 28.

We claim:

1. A method of making semiconductor devices comprising the steps of:

(a) providing on a surface of a substrate of low resistivity P type semiconductor material a region of high resistivity semiconductor material, (b) providing on the surface of the first region a second region of a semiconductor material, said second region being a conductivity type or types required by the semiconductor devices being formed, (c) providing on the second region a metal body, (d) electrolytically etching away the substrate to expose the first region, (e) chemically etching away the first region to provide a composite of the second region and the metal body, and then (f) dividing the composite into individual semiconductor devices each on a metal body.

2. The method in accordance with claim 1 in which prior to providing the metal body on the second region the surface of the second region is coated with a metal film and the metal body is applied to the metal film.

3. The method in accordance with claim 2 in which the metal body is electroplated onto the metal film.

4. The method in accordance with claim 1 in which the first region is thinner than the second region and includes a carrier concentration of no greater than approximately $10^{17}$ cm.$^{-3}$.

5. The method in accordance with claim 1 in which the substrate is electrolytically etched away by providing a metal film contact on a portion of an exposed surface of the substrate adjacent the edge of the substrate immersing the substrate in an electrolytic bath containing and a cathode with the cathode being connected to the negative side of a D.C. current source and the contact on the substrate being connected to the positive side of the current source, the substrate is immersed in the bath with the portion of the substrate farthest from the contact being immersed first and the surface of the substrate being at an angle to the surface of the cathode such that the contact is farthest from the cathode and the first immersed portion of the substrate is closest to the cathode.

6. The method in accordance with claim 5 in which the substrate is slowly immersed in the bath by a repeated dipping operation so that a portion of the substrate is etched away first and the etching progresses along the substrate to the contact.

7. The method in accordance with claim 6 in which all of the substrate is electrolytically etched away except for the portion directly under the contact and the portion of the substrate directly under the contact is then removed by a chemical etch.

8. The method in accordance with claim 1 in which after the first region is removed, individual metal contact pads are provided in spaced relation on the portions of the exposed surface of the second region which are to form the individual semiconductor devices, and the composite is divided along lines between the contact pads.

9. The method in accordance with claim 8 in which the composite is divided by first removing the portions of the second region between and around the contact pads to form a plurality of individual semiconductor devices on the metal body and then dividing the metal body along lines between the individual semiconductor devices.

10. The method in accordance with claim 1 in which the substrate is silicon and is electrolytically etched in an aqueous solution of a mixture of hydrofluoric acid and sulfuric acid so as to permit the etching to be carried out with a high current density and low applied voltage.

References Cited

UNITED STATES PATENTS

| | | | |
|---|---|---|---|
| 2,871,174 | 1/1959 | Turner | 204—129.75 |
| 3,316,164 | 4/1967 | Welch, Jr. | 204—129.75 |
| 3,536,600 | 10/1970 | Van Dijk et al. | 204—129.1 |
| 3,607,466 | 9/1971 | Miyazaki | 29—576 |

TA-HSUNG TUNG, Primary Examiner

U.S. Cl. X.R.

204—129.75; 29—576

UNITED STATES PATENT OFFICE

CERTIFICATE OF CORRECTION

Patent No. 3,728,236 Dated April 17, 1973

Inventor(s) Kenneth Perry Weller and Cheng Paul Wen

It is certified that error appears in the above-identified patent and that said Letters Patent are hereby corrected as shown below:

IN THE SPECIFICATION:

Column 1, line 39, "devcies" should be --devices--

Column 2, line 45, after "semiconductor" insert --compound, depending on the type of--

IN THE CLAIMS:

Claim 1, line 4, after "a" insert --first--

Claim 5, line 4, after "substrate" (second occurrence) insert --and-- line 6, cancel "and".

Signed and sealed this 20th day of November 1973.

(SEAL)
Attest:

EDWARD M.FLETCHER,JR.
Attesting Officer

RENE D. TEGTMEYER
Acting Commissioner of Patents